United States Patent [19]
Lin et al.

[11] Patent Number: 6,013,397
[45] Date of Patent: Jan. 11, 2000

[54] METHOD FOR AUTOMATICALLY FORMING A PHASE SHIFTING MASK

[75] Inventors: Chin-Lung Lin, Kaohsiung; Yao-Ching Ku, Hsinchu Hsien, both of Taiwan

[73] Assignee: United Microelectronics Corp., Taipei, Taiwan

[21] Appl. No.: 09/186,127

[22] Filed: Nov. 4, 1998

[51] Int. Cl.$^7$ ........................................................ G03F 9/00
[52] U.S. Cl. .................................................................. 430/5
[58] Field of Search ..................... 430/5, 22, 322

[56] References Cited

U.S. PATENT DOCUMENTS 5,591,549  1/1997  Yang ........................................... 430/5

Primary Examiner—S. Rosasco
Attorney, Agent, or Firm—Thomas, Kayden, Horstemeyer & Risley

[57] ABSTRACT

A method for automatically forming a sub-resolution PSM is provided. The shielding layer is designed by adding an assist feature to a peripheral region of an original shielding layer formed on a quartz substrate. Using an etching process with a etching mask, a portion of the original shielding layer is removed to form an original pattern and an assist feature. The assist feature is separated from the original pattern by a distance. A photoresist layer is formed on the rim of the shielding layer so that the original pattern, half of the assist feature, and an exposed portion of the quartz substrate between the original pattern and the assist feature are exposed. A selective etching process is performed to etch the exposed portion of the quartz substrate to a certain depth so that it behaves like a phase shifting layer. After removing the photoresist layer, the sub-resolution PSM including the integrated circuit pattern and the assist feature is complete.

14 Claims, 3 Drawing Sheets

METHOD FOR AUTOMATICALLY FORMING A PHASE SHIFTING MASK

BACKGROUND OF THE INVENTION

1. Field of the Invention

This invention relates to semiconductor fabrication, and more particularly to a method for fabricating a phase shift mask (PSM) by automatically forming a phase shifting layer and a shielding layer, using an original program designer file.

2. Description of Related Art

Currently, photolithography plays an essential role in semiconductor fabrication. For example, processes for patterning a structure or doping a region in a wafer always need several photolithography processes. In a photolithography process, exposure resolution and depth of focus (DOF) are two important parameters that determine photolithography quality. As the integration of semiconductor devices increases, a high pattern exposure resolution becomes critical. One proposed solution to obtaining a high pattern exposure resolution would use a light source with a shorter wavelength, such as a deep ultraviolet light with a wavelength of 2480 angstroms produced by a Kr laser. However, even though a light source with shorter wavelength can increase the pattern exposure resolution the DOF deteriorates. Recently, another solution is proposed that uses a phase shifting, mask (PSM) in photolithography technology so as to obtain a high pattern resolution.

The theory of a PSM is to use a shifter layer formed on a conventional photomask. The shifter layer has a light inversion property that inverts the phase of light passing through the shifting layer. When the PSM is exposed to a light source, the light passing the shifting layer has an inverted wave phase and can interfere with a normal light, having not passed through the shifter layer. Since the amplitude of the inverted wave phase is negative an amplitude subtraction occurs around the interface between the normal light and the inverted wave light, resulting in a zero amplitude. When a wafer is exposed by light that has passed through the PSM, a light intensity distribution, which is the square of the amplitude distribution, with better resolution appears on the wafer. The light intensity distribution actually forms a desired pattern with a better pattern resolution. Using the PSM to obtain a better pattern resolution does not need a new light source with a short wavelength. This is the advantage of the PSM.

FIGS. 1A–1C are schematic. cross-sectional views of some conventional PSMs. In FIG. 1A, a general PSM conventionally has a shielding layer 12 including chromium and a phase shifting layer 14 formed on a transparent quartz substrate 10. The phase shifting layer 14 fully fills some of the regions of the quartz substrate 10 exposed by the shielding layer 12. In FIG. 1B, a rim PSM conventionally has a shielding layer 12 on the quartz substrate 10. and a larger shifting layer 16 covering the shielding layer 12. In FIG. 1C, an alternating PSM conventionally has a phase shifting layer 18 on the quartz substrate 10 with some regular openings, and a shielding layer 12 alternatingly fills the openings of the shifting layer 18. The shifting layers 14, 16, and 18 include $MoSi_2O_xN_y$, or $SiO_xN_y$ can shift the light wave phase by 180°.

FIG. 2 is a light amplitude distribution on the PSM of FIG. 1C. The horizontal axis is the location across the alternating PSM. Referring to FIG. 1C and FIG. 2, the negative amplitude comes from the phase shifting layer 18, which shifts the light wave phase by 180°. The positive amplitude results from the exposed portion of the quartz substrate 10. The actual amplitude is the summation of the positive amplitude and the negative amplitude. A zero amplitude can occur at the interface between the positive amplitude and the negative amplitude. After taking the square of the amplitude distribution, a light intensity with a better pattern resolution is obtained. The actual exposed light on the wafer is proportional to the intensity.

However, all of above three types of PSM need at least two patterning processes. One is the shielding layer and another one is the phase shifting layer. Since the desired patterns are usually designed by engineers, it is easy to make an accidental design error, and time is consumed.

SUMMARY OF THE INVENTION

It is therefore an objective of the present invention to provide a method for automatically forming, a sub-resolution PSM by using an original program designer file for an integrated circuit design. Both patterns of a phase shifting layer and a shielding layer are automatically formed, rather than being formed by hand, so that accidental error is avoided and fabrication efficiency is effectively increased.

In accordance with the foregoing and other objectives of the present invention, a method for automatically forming a sub-resolution PSM is provided. The shielding layer is designed by adding an assist feature to a peripheral region of an original shielding layer formed on a quartz substrate. Using an etching process, a portion of the original shielding layer is removed to form a shielding layer including a part of the integrated circuit pattern and a part of the assist feature. The assist feature is formed on the periphery of the integrated circuit and is separated by a distance from the integrated circuit. A photoresist layer is formed on the rim of the shielding layer so that the integrated circuit pattern and a half of the assist feature are still exposed, without being covered by the photoresist layer. A selective etching process is performed to etch the exposed portion of the silicon quartz substrate to a certain depth in the quartz substrate. The portion of the etched quartz serving as a phase shifting layer can also shift the light wave phase by 180°. After removing the photoresist layer, the sub-resolution PSM including the integrated circuit pattern and the assist feature is complete.

BRIEF DFSCRIPTION OF DRAWINGS

The invention can be more fully understood by reading the following detailed description of the preferred embodiment, with reference made to the accompanying drawing,s as follows.

DETAILED DESCRIPTION OF PREFERRED EMBODIMENT

Figure 1A:
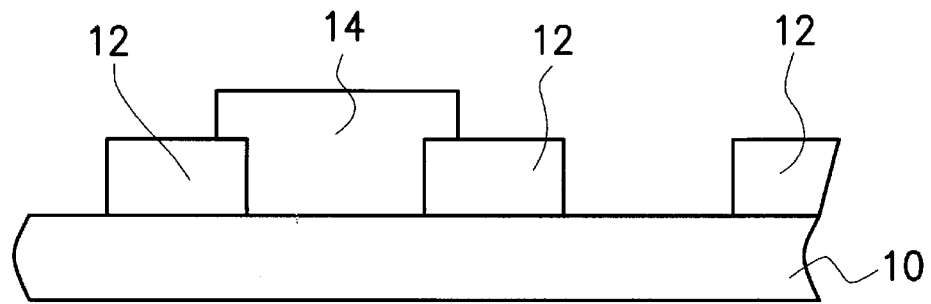
FIGS. 1A–1C are schematic, cross-sectional views of some conventional phase shifting masks (PSMs)
Figure 1B:
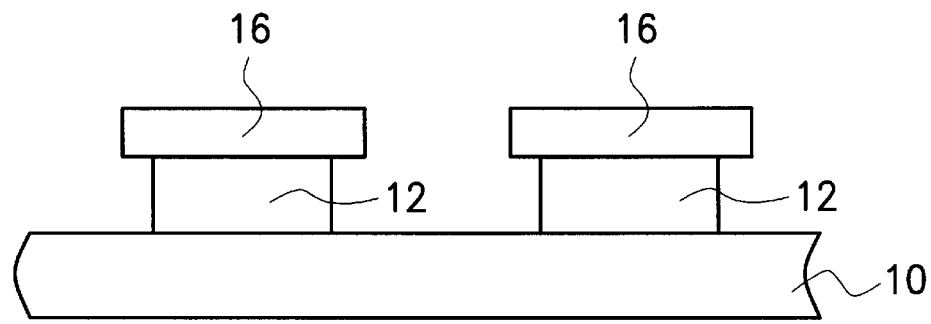
Figure 1C:
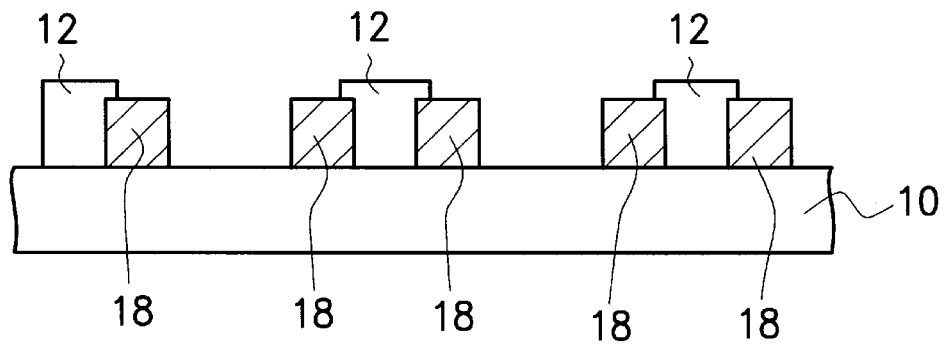
Figure 2:
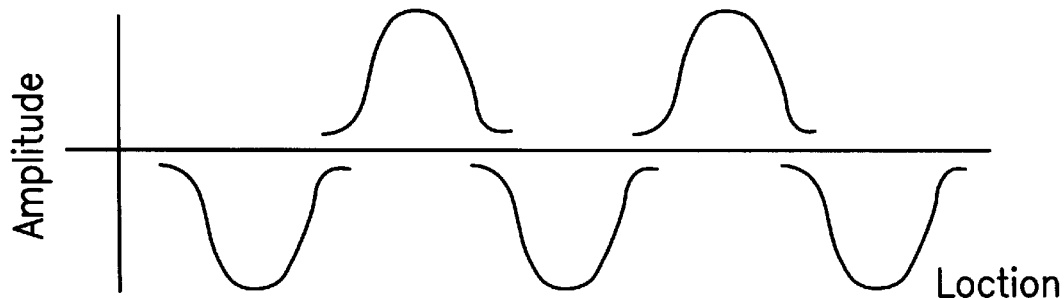
FIG. 2 is a light amplitude distribution on the PSM of FIG. 1C.
Figure 3A:
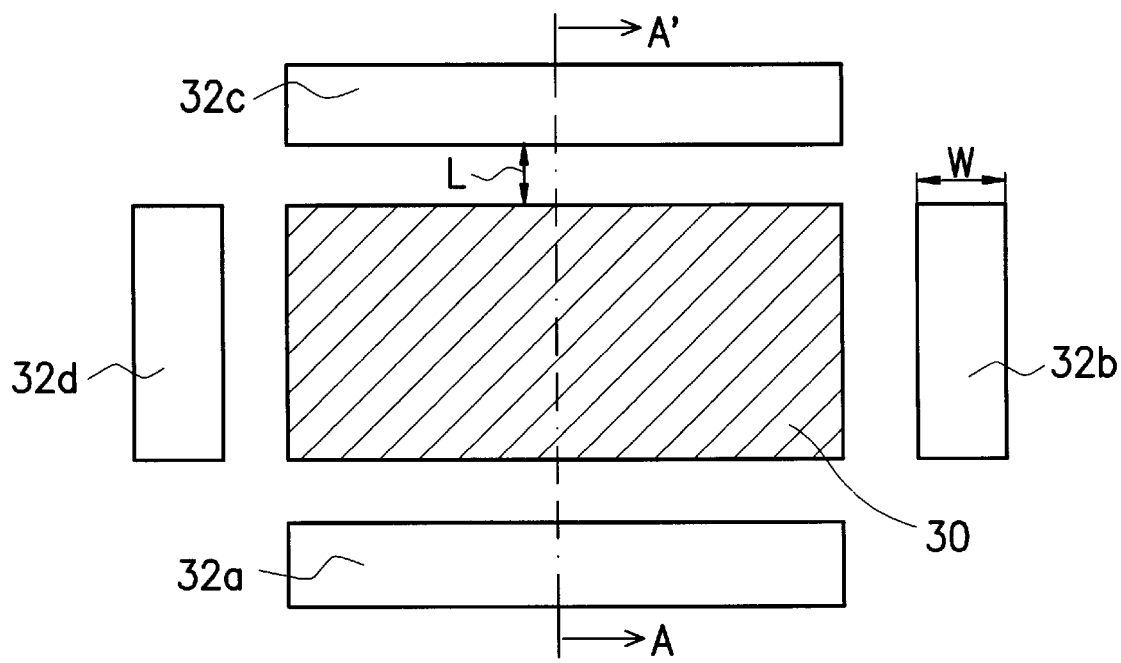
FIG. 3A is a top view. schematically illustrating a shielding layer of a sub-resolution PSM according to a preferred embodiment of the invention.

FIG. 3A is a top view, schematically illustrating a shielding layer of a sub-resolution PSM according to a preferred embodiment of the invention. In FIG. 3A, an original shielding layer is formed with an original pattern 30, which can be any kind of integrated circuit pattern. The invention includes some assist features 32a, 32b, 32c, and 32d in the periphery of the original pattern 30. The assist features 32a, 32b, 32c, and 32d are used to pattern a phase shifting layer (not shown). There is a distance L of about 0.05–0.5 microns between the original pattern 30 and the assist features 32a, 32b, 32c, and 32d, all of which have a width W of about 0.05–0.5 microns.

Figure 3B:
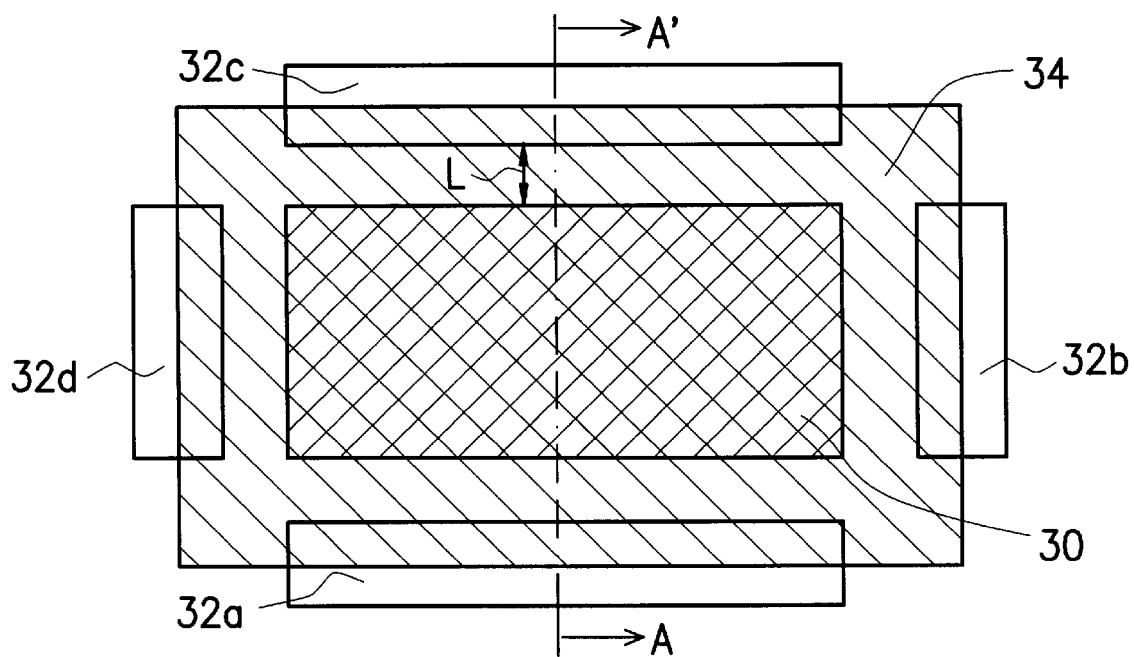
FIG. 3B is a top view, schematically illustrating a phase shifting layer of a sub-resolution PSM according to a preferred embodiment of the invention.

FIG. 3B is a top view, schematically illustrating a phase shifting layer of a sub-resolution PSM according to a preferred embodiment of the invention. In FIG. 3B, a phase shifting region 34 is defined to include the original pattern 30 and a portion of each of the assist features 32a, 32b, 32c, and 32d. The portion of each of the assist features 32a, 32b, 32c, and 32d is preferably half the original width of the assist feature, that is, W/2. So, each edge of the phase shifting region 34 has a distance of L+W/2 to the edge of the original pattern 30.

Figure 4A:
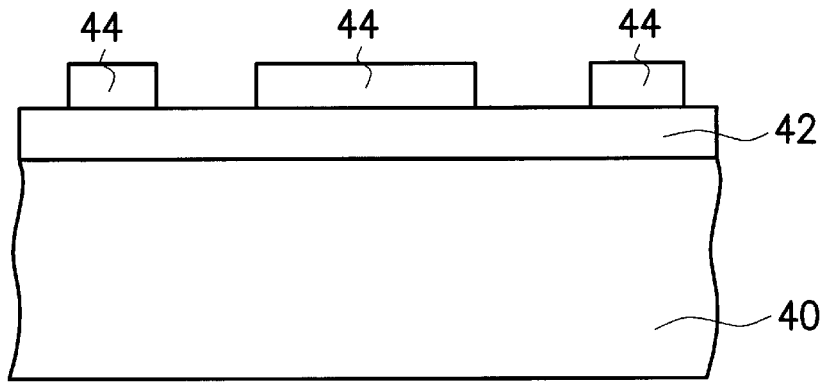
FIGS. 4A–4D are cross-sectional view taken along the line AA' in FIG. 3A and FIG. 3B. schematically illustrating a fabrication process of a sub-resolution PSM acording to a preferred embodiment.

FIGS. 4A–4D are cross-sectional views taken along the line AA' in FIG. 3A and FIG. 3B, schematically illustrating a fabrication process for a sub-resolution PSM according to a preferred embodiment. In FIG. 4A, a transparent substrate 40 including, for example, quartz, is provided. A shielding layer 42 is formed over the substrate 40. The shielding layer 42 includes, for example, chromium. A first photoresist layer 44 is ormed over the shielding layer 42 and exposes a portion of the shielding layer 42. The purpose of the first photoresist layer 44 is to form a pattern structure shown in FIG. 3A so that the exposed portion has a width of L (FIG. 3A).

Figure 4B:
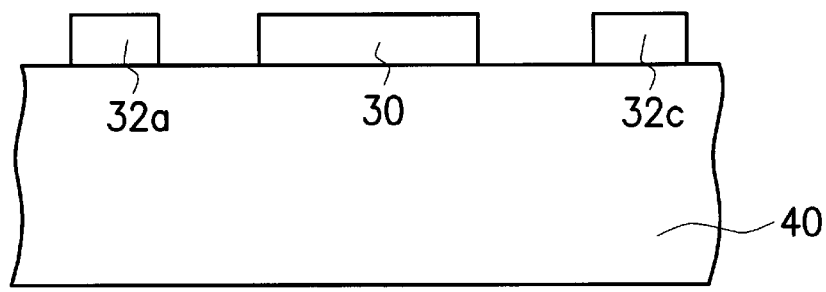

In FIG. 4B. using the first photoresist layer 44 as an etching mask, an etching process is performed to etch the exposed portion of the shielding layer 42 of FIG. 4A 5 and expose the quartz substrate 40 accordingly. Also referring to FIG. 3A, after removing the first photoresist layer 44, the remaining portion of the shielding layer 42 of FIG. 4A forms the original pattern 30, which can be any kind of conventional IC pattern, and the assist features 32a, 32b, 32c, and 32d. The assist features 32b and 32d cannot be seen in FIGS. 4A–4D.

Figure 4C:
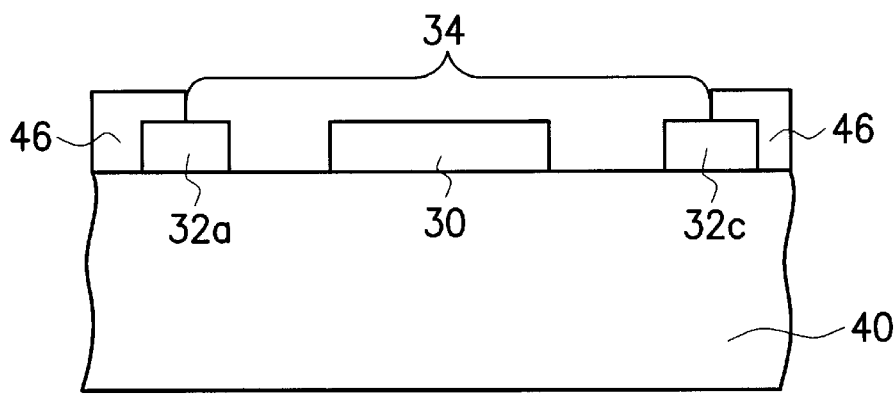
Figure 4D:
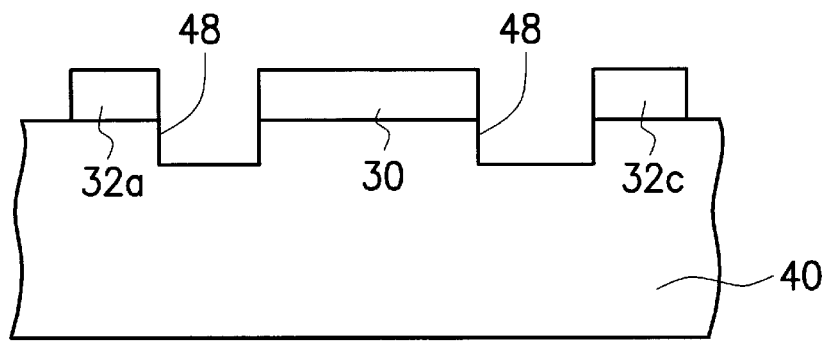

In FIG. 4C. a second photoresist layer 46 is partially formed over the substrate 40. A phase shifting region 34, also seen in FIG. 3B, is exposed by the second photoresist layer 46. In FIG. 4D, a selective etching process is performed to form a trench-like concave region in the quartz substrate 40 by etching only on the exposed quartz substrate 40 to a certain depth, which allows passing, light wave phase to be shifted by 180°. After removing the second photoresist layer, a phase shifting layer 48 is thereby formed in the quartz substrate 40. The quartz substrate 40 thereby includes the phase shifting region 34 and a normal region other than the phase shifting region 34.

The invention includes the addition of the assist features 32a, 32b, 32c, and 32d to the periphery of the original pattern 30. The assist features 32a, 32b, 32c, and 32d serve as additional shielding layers for the original pattern 30 and are used to form the phase shifting layer 48 in the substrate 40. The assist features 32a, 32b, 32c, and 32d and the phase shifting layer 48 can be formed through just a little modification to original program designer file. The first photoresist layer 44 for a shielding layer and the second photoresist layer 46 for a phase shifting layer are automatically formed. It is therefore not necessary to design the first photoresist layer 44 and the second photoresist layer 46 by hand. This can avoid an accidental error on the part of the designer.

The invention has been described using, an exemplary preferred embodiment. However, it is to be understood that the scope of the invention is not limited to the disclosed embodiment. On the contrary. it is intended to cover various modifications and similar arrangements. The scope of the claims, therefore, should be accorded the broadest interpretation so as to encompass all such modifications and similar arrangements.

What is claimed is:

1. A method using an original pattern for automatically forming a sub-resolution phase shifting mask (PSM), the method comprising:

forming a shielding layer on a transparent substrate;

forming a first photoresist layer with a pattern over the shielding layer;

etching the shielding layer, using the first photoresist layer as an etching mask, to form the original pattern and an assist feature around the original pattern, wherein the assist feature is separated from the original pattern by a distance;

removing the first photoresist layer;

forming a second photoresist layer over the substrate so as to expose a phase shifting region, which comprises the original pattern, an exposed portion of the substrate between the original pattern and the assist feature, and a portion of the assist feature;

etching the exposed portion of the substrate, using the second photoresist layer as an etching mask, so as to form a phase shifting layer in the substrate; and removing the second photoresist layer so that the substrate comprises the phase shifting region and a normal region other than the phase shifting region.

2. The method of claim 1, wherein the shielding layer comprises chromium.

3. The method of claim 1, wherein the distance between the original pattern and the assist feature is between about 0.05 and 0.5 microns.

4. The method of claim 1, wherein the assist feature is between about 0.05 and 0.5 microns wide.

5. The method of claim 1, wherein the step of etching the exposed portion of the substrate comprises performing a selective etching process to etch only the exposed portion of the substrate.

6. The method of claim 5, wherein the step of performing the selective etching process comprises formation of a trench-like concave region in the substrate to a depth that allows a passing light wave phase to be shifted by 180°.

7. The method of claim 1, wherein the substrate comprises quartz.

8. The method of claim 1, wherein in the step of forming a second photoresist layer over the substrate, half of the assist feature is covered by the first photoresist layer.

9. A method for automatically forming a sub-resolution phase shifting mask (PSM), the method comprising:

forming a chromium layer on a quartz substrate;

designing a shielding pattern, which comprises an original pattern and a plurality of assist features;

forming a positive-type first photoresist layer with the shielding pattern over the chromium layer;

etching the chromium layer, using the first photoresist layer as an etching mask, to form the original pattern and the assist features around the original pattern, wherein each of the assist features is separated from the original pattern by a distance;

removing the first photoresist layer;

forming a negative-type second photoresist layer over the substrate so as to expose a phase shifting region which comprises the original pattern, an exposed portion of the substrate between the original pattern and the assist features, and a portion of each of the assist features;

etching the exposed portion of the substrate, using the second photoresist layer as a etching mask, so as to form a phase shifting layer in the substrate; and removing the second photoresist layer so that the substrate comprises the phase shifting region and a normal region other than the phase shifting region.

10. The method of claim 9, wherein the distance between the original pattern and the assist features is between about 0.05 and 0.5 microns.

11. The method of claim 9, wherein a width of each of the assist features is between about 0.05 and 0.5 microns.

12. The method ot claim 9, wherein the step of etching the exposed portion of the substrate comprises performing a selective etching process to etch only the exposed portion of the substrate.

13. The method of claim 12, wherein the step of performing the selective etching process comprises a formation of a trench-like concave region in the substrate to a depth that allows a passing light wave phase to be shifted by 180°.

14. The method of claim 9, wherein in the step of forming a second photoresist layer over the substrate, half of the assist features is covered by the first photoresist layer.

* * * * *